US009754795B2

(12) United States Patent
Hua et al.

(10) Patent No.: US 9,754,795 B2
(45) Date of Patent: Sep. 5, 2017

(54) CHEMICAL-MECHANICAL PLANARIZATION PROCESS USING SILICON OXYNITRIDE ANTI-REFLECTIVE LAYER

(71) Applicant: CSMC TECHNOLOGIES FAB2 CO., LTD., Jiangsu (CN)

(72) Inventors: Qiang Hua, Jiangsu (CN); Yaohui Zhou, Jiangsu (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 0 days.

(21) Appl. No.: 15/120,323

(22) PCT Filed: Apr. 30, 2015

(86) PCT No.: PCT/CN2015/078121
§ 371 (c)(1),
(2) Date: Aug. 19, 2016

(87) PCT Pub. No.: WO2015/165421
PCT Pub. Date: Nov. 5, 2015

(65) Prior Publication Data
US 2017/0069507 A1    Mar. 9, 2017

(30) Foreign Application Priority Data

Apr. 30, 2014   (CN) .......................... 2014 1 0180862

(51) Int. Cl.
*H01L 21/02* (2006.01)
*H01L 21/304* (2006.01)
(Continued)

(52) U.S. Cl.
CPC .... *H01L 21/31056* (2013.01); *H01L 21/0214* (2013.01); *H01L 21/0217* (2013.01);
(Continued)

(58) Field of Classification Search
None
See application file for complete search history.

(56) References Cited

U.S. PATENT DOCUMENTS 6,048,765 A    4/2000  Wu
6,258,692 B1 * 7/2001  Chu .................. H01L 21/76229
                                            257/E21.548
(Continued)

FOREIGN PATENT DOCUMENTS

CN       101330037       12/2008
CN       101359596        2/2009
(Continued)

OTHER PUBLICATIONS

International Search Report for PCT/CN2015/078121, dated Aug. 28, 2015, 8 pages including English translation.

*Primary Examiner* — Shamim Ahmed
(74) *Attorney, Agent, or Firm* — Hamre, Schumann, Mueller & Larson, P.C.

(57) ABSTRACT

A chemical-mechanical polishing process using a silicon oxynitride anti-reflection layer (S340) includes: (S1) providing a semiconductor wafer comprising a substrate (S310), an oxidation layer (S320) formed on the substrate (S310), a silicon nitride layer (S330) formed on the oxidation layer (S320), an anti-reflection layer (S340) formed on the silicon nitride layer (S330), a trench extending through the anti-reflection layer (S340) and into the substrate (S310), and a first silicon dioxide layer (S350) filling the trench and covering the anti-reflection layer (S340); (S2) polishing the first silicon dioxide layer (S350) until the anti-reflection layer (S340) is exposed; (S3) removing the anti-reflection layer (S340) by dry etching; (S4) forming a second silicon dioxide layer (S360) on the surface of the semiconductor wafer from which the anti-reflection layer (S340) is removed; (S5) polishing the second silicon dioxide layer
(Continued)

(S360) until the silicon nitride layer (S330) is exposed; (S6) and, removing the silicon nitride layer (S330).

10 Claims, 8 Drawing Sheets

(51) Int. Cl.
    *H01L 21/3105*      (2006.01)
    *H01L 21/762*      (2006.01)
    *H01L 21/308*      (2006.01)
    *H01L 21/311*      (2006.01)

(52) U.S. Cl.
    CPC .. *H01L 21/31053* (2013.01); *H01L 21/31116* (2013.01); *H01L 21/762* (2013.01); *H01L 21/02164* (2013.01); *H01L 21/02211* (2013.01); *H01L 21/02274* (2013.01); *H01L 21/3081* (2013.01); *H01L 21/31111* (2013.01)

(56) References Cited

U.S. PATENT DOCUMENTS

| | | | |
|---|---|---|---|
| 2003/0203515 A1* | 10/2003 | Lin | H01L 21/31053 438/8 |
| 2003/0211702 A1* | 11/2003 | Parat | H01L 21/76229 257/E21.548 |
| 2004/0175900 A1* | 9/2004 | Lin | H01L 21/76232 438/425 |
| 2005/0153519 A1* | 7/2005 | Lu | H01L 21/02164 438/424 |
| 2005/0153521 A1 | 7/2005 | Kanamitsu et al. | |
| 2006/0099771 A1* | 5/2006 | Chen | H01L 21/76232 438/424 |
| 2011/0006390 A1* | 1/2011 | Huang | H01L 21/76224 257/510 |

FOREIGN PATENT DOCUMENTS

| | | |
|---|---|---|
| CN | 101714518 | 5/2010 |
| CN | 102569161 | 7/2012 |
| CN | 103227143 | 7/2013 |

* cited by examiner

CHEMICAL-MECHANICAL PLANARIZATION PROCESS USING SILICON OXYNITRIDE ANTI-REFLECTIVE LAYER

FIELD OF THE INVENTION

The present invention relates to semiconductor technology, and more particularly relates to a chemical-mechanical polishing process based on silicon oxynitride anti-reflection layer.

BACKGROUND OF THE INVENTION

During the semiconductor Shallow Trench Isolation (STI) production process, there are two main ways of Chemical Mechanical Polishing (CMP) for the STI, i.e. Reverse CMP and Direct CMP. Under normal circumstances, Direct CMP will not be used in a case of the STI layer using SiON as an anti-reflection layer, the reason for this is because remaining silicon oxynitride on SiN surface cannot be removed by phosphoric acid ($H_3PO_4$) after STI CMP, thus resulting the SiN cannot be wet peeled off.

Currently, in order to precisely control the critical dimension (CD), silicon oxynitride is usually used as the anti-reflection layer. FIGS. 1A to 1D illustrate a flow chart of a conventional Direct CMP STI process. Referring to FIGS. 1A to 1D, in step (a), an oxidation layer (Pad-Ox) S120 is formed on a silicon substrate S110, a silicon nitride layer S130 is formed on a surface of the Pad-Ox S120, a silicon oxynitride layer (anti-reflection layer) S140 is formed on a surface of the silicon nitride layer S130; in step (b), STI-ETCH is performed to etch a depth of the STI, after STI-ETCH, a silicon dioxide ($SiO_2$) layer S150 is deposited using high density plasma chemical vapor deposition (HDP-CVD); in step (c), the silicon dioxide layer S150 on a surface of the anti-reflection layer S140 is polished via Direct CMP until the anti-reflection layer S140 is exposed; in step (d), the silicon nitride layer S130 is removed by reacting of phosphoric acid ($H_3PO_4$) with the silicon nitride layer S130, thus forming an active region and an isolation region.

Referring to FIGS. 1A to 1D, when silicon oxynitride on the surface of the STI layer is used as the anti-reflection layer S140, Direct CMP method would no longer be applicable. The reason is that, during Direct CMP, there is a high selectivity (more than 10:1) of the slurry to $SiO_2$/SiON, such that CMP will stop at the surface of the silicon oxynitride. The slurry can react with the surface of the silicon oxynitride, thus forming a layer of relatively dense complex A (referring to step (d)). The complex A will prevent phosphoric acid from reacting with the silicon nitride, resulting in silicon nitride cannot be removed.

FIG. 2A and FIG. 2B are schematic morphology graphs showing silicon oxynitride as the anti-reflection layer after cleaning the silicon nitride. As can be seen from FIG. 2A and FIG. 2B that, due to the blocking of the complex on the surface of the silicon nitride, the silicon nitride on the most region (in region B and C of the figures) cannot be removed.

In order to address this issue, wafer fabrication factory (FAB) usually employs two circumvent ways:

a), using Reverse STI CMP with different slurries to substitute Direct CMP. The defect of this method is that, an additional reverse mask is required to perform exposure, etching, cleaning, therefore the process is relatively complex, and the yield is low;

b), using an organic bottom anti-reflection coating (Organic BARC) layer as the anti-reflection layer to substitute silicon oxynitride on the STI layer. The defect of this method is that, it will be more difficult to control CD during STI-ETCH using organic BARC, thus the mass production process control difficulty is increased.

SUMMARY OF THE INVENTION

Accordingly, it is necessary to provide a chemical-mechanical polishing process based on a silicon oxynitride anti-reflection layer, which is simple, the CD control thereof is easy, and the problem of silicon nitride cannot be peeled off can be effectively solved.

A chemical-mechanical polishing process based on a silicon oxynitride anti-reflection layer includes: providing a semiconductor wafer, the semiconductor wafer comprising a substrate, an oxidation layer formed on the substrate, a silicon nitride layer formed on the oxidation layer, an anti-reflection layer formed on the silicon nitride layer, a trench extending through the anti-reflection layer and into the substrate, and a first silicon dioxide layer filled in the trench and covering the anti-reflection layer;

polishing the first silicon dioxide layer until the anti-reflection layer is exposed;

removing the anti-reflection layer by dry etching;

forming a second silicon dioxide layer on a surface of the semiconductor wafer from which the anti-reflection layer is removed;

polishing the second silicon dioxide layer until the silicon nitride layer is exposed; and removing the silicon nitride layer.

Beneficial effects: according to the process of the present invention, after the conventional Direct CMP, the surface of the wafer is subject to plasma treatment. The surface of silicon oxynitride is subjected to bombardment using gas with a greater ion bombardment capability as well as a certain amount of fluorocarbon, such that the bond of complex on the surface is opened, and the fluorocarbon can react with the silicon oxynitride, and the silicon oxynitride is finally etched off. The silicon dioxide located inside the trench is also etched, such that a height difference between the silicon nitride and the silicon dioxide will be increased. After a silicon dioxide layer with a thickness of 2 μm is deposited, a second CMP is performed, which ends at the surface of the silicon nitride, such that the height difference between the silicon nitride and the silicon dioxide will be decreased. The silicon nitride is then completely removed by phosphoric acid, thus forming an active region and an isolation region. In the process of the present invention, there is no need to add an extra reverse STI mask, a corresponding exposing, etching, and rinsing, thus simplifying the process. The present invention uses silicon oxynitride as the anti-reflection layer, such that the control for CD is relatively simple, and the silicon nitride can be peeled off effectively.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

The above objects, features and advantages of the present invention will become more apparent by describing in detail embodiments thereof with reference to the accompanying drawings. It will be understood that the particular method and device embodying the invention are shown by way of illustration and not as a limitation of the invention.

Figure 1A:
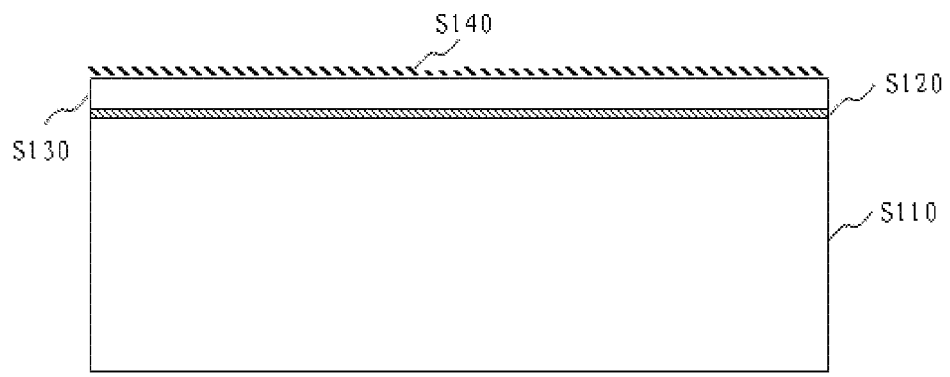
FIG. 1A to FIG. 1D illustrate a flow chart of a conventional Direct CMP STI process.
Figure 1B:
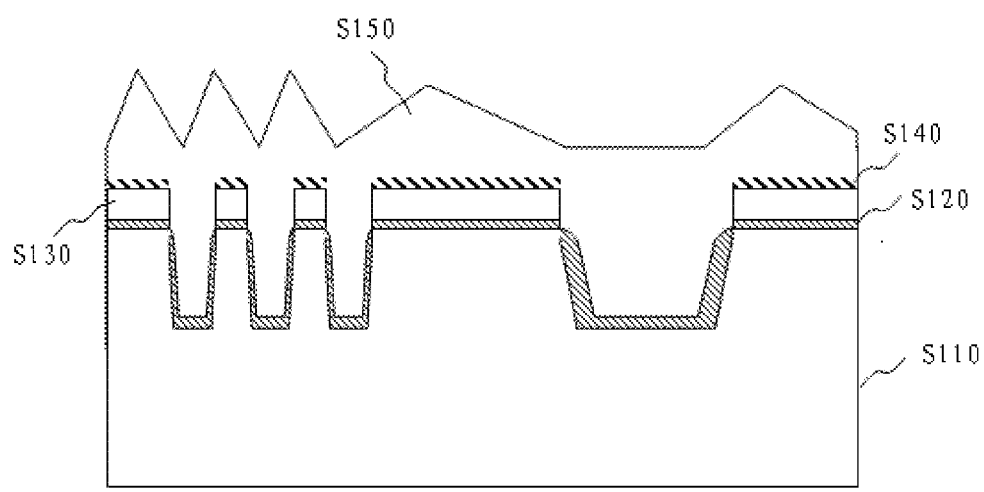
Figure 1C:
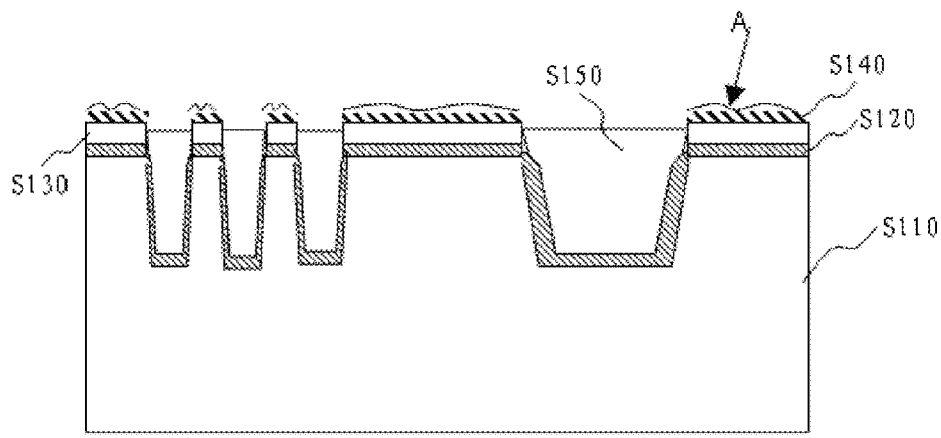
Figure 1D:
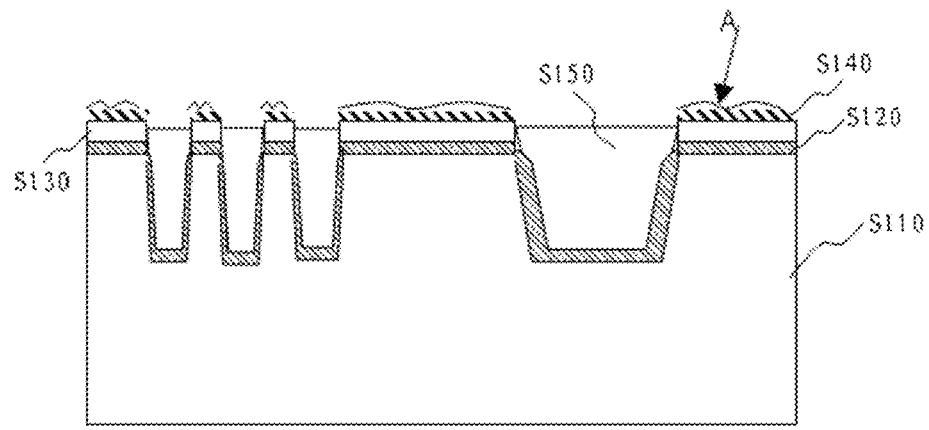
Figure 2A:
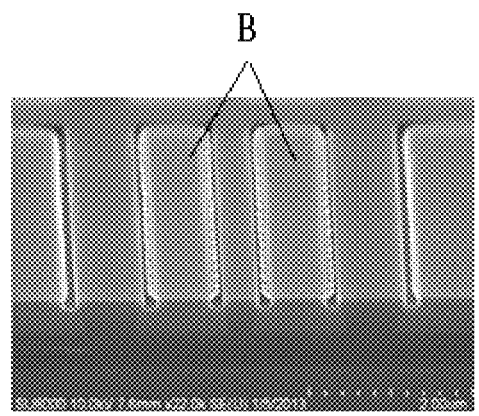
FIG. 2A to FIG. 2B are schematic morphology graphs showing silicon oxynitride layer as the antireflection after cleaning the silicon nitride.
Figure 2B:
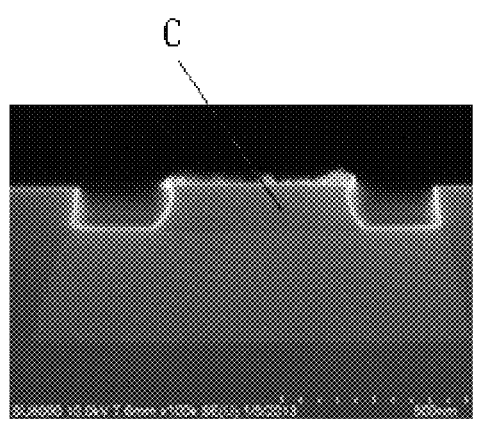
Figure 3:
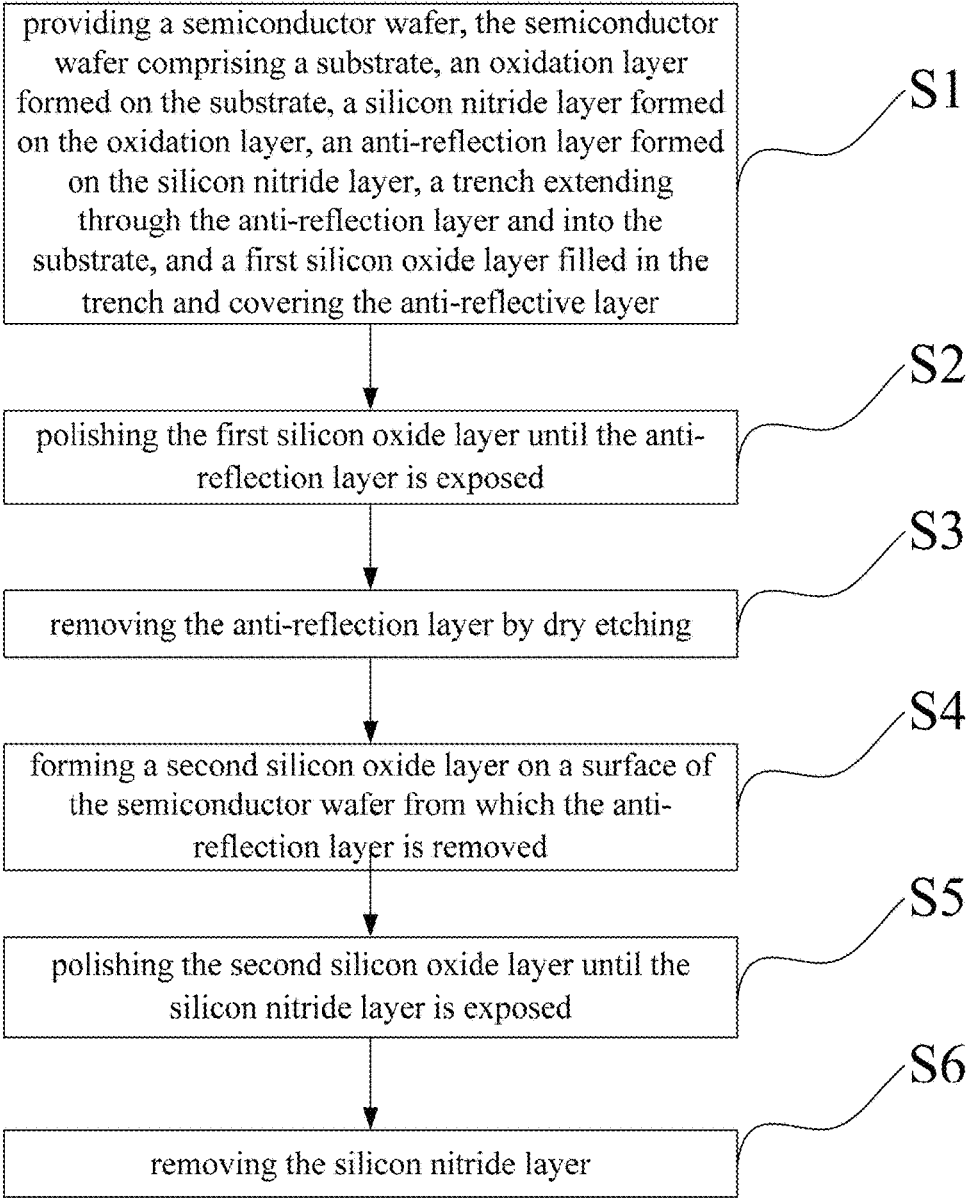
FIG. 3 is a flow chart of a chemical-mechanical polishing process based on a silicon oxynitride anti-reflection layer according to one embodiment.
Figure 4A:
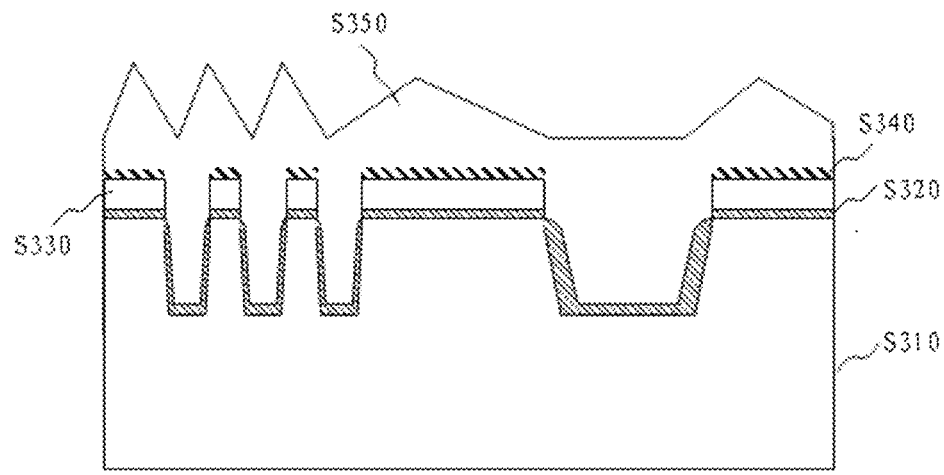
FIG. 4A to FIG. 4F are schematic views of the chemical-mechanical polishing process based on a silicon oxynitride anti-reflection layer according to one embodiment.

FIG. 3 is a flow chart of a chemical-mechanical polishing process based on a silicon oxynitride anti-reflection layer according to one embodiment. FIG. 4A to FIG. 4F are schematic views of the chemical-mechanical polishing process based on a silicon oxynitride anti-reflection layer according to one embodiment. A chemical-mechanical polishing process based on a silicon oxynitride anti-reflection layer according to one embodiment includes the following steps:

In step S1, a semiconductor wafer is provided. Referring to FIG. 4A, the semiconductor wafer includes a substrate S310, an oxidation layer S320 formed on the substrate, a silicon nitride layer S330 formed on the oxidation layer S320, an anti-reflection layer S340 formed on the silicon nitride layer S330, a trench extending through the anti-reflection layer S340 and into the substrate, and a first silicon dioxide layer S350 filled in the trench and covering the anti-reflection layer S340. In the illustrated embodiment, the anti-reflection layer S340 is a silicon oxynitride layer. In alternative embodiments, anti-reflection layer S340 can be made of other materials. In the present step, the first silicon dioxide layer S350 is formed by high-density plasma chemical vapor deposition (HDP-CVD), the high-density plasma is a mixture of $SiH_4$, $O_2$ and Ar, a deposition temperature ranges from 380° C. to 400° C., a pressure is 450 Torr, a deposition time is 220 s. In one embodiment, the composition ratio of $SiH_4$, $O_2$ and Ar in the mixture of the high-density plasma is not limited hereto and can be determined according to actual situation of the production. In one embodiment, the deposition temperature is 390° C. In alternative embodiments, the deposition pressure and time can be optimized according to actual situation of the production.

Figure 4B:
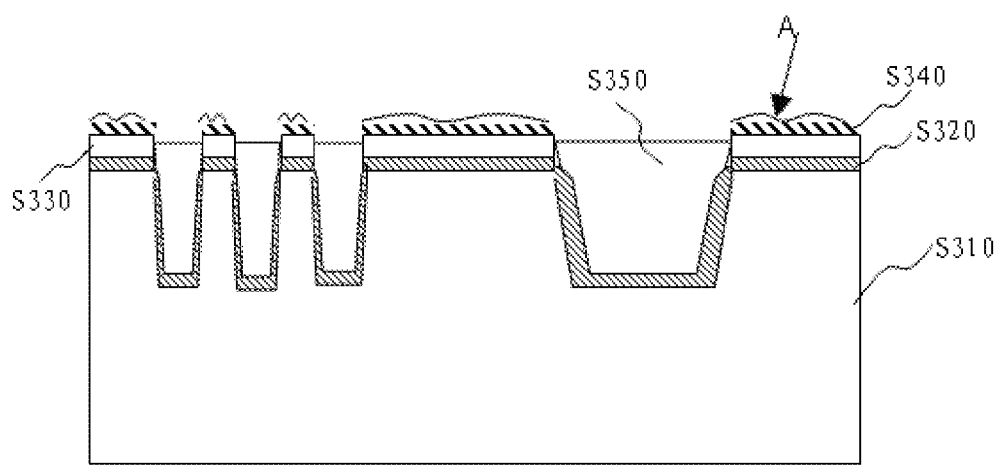

In step S2, the first silicon dioxide layer S350 is polished until the anti-reflection layer S340 is exposed. Referring to FIG. 4B, in the present step, a slurry containing $SiO_2$ as a main composition is used to polish the first silicon dioxide layer S350 by CMP until the anti-reflection layer S340 is exposed, and a polishing time is from 30 s to 50 s. In the illustrated embodiment, the step is performed under an ambient temperature and pressure. In one embodiment, the slurry is a mixture containing at least two ingredients, in which the proportion of $SiO_2$ in the mixture is greater than that of other ingredients. In alternative embodiments, the slurry can be merely made of $SiO_2$. During polishing, the slurry will react with a surface of the anti-reflection layer S340, thus forming a layer of relatively dense complex A (referring to FIG. 4B).

Figure 4C:
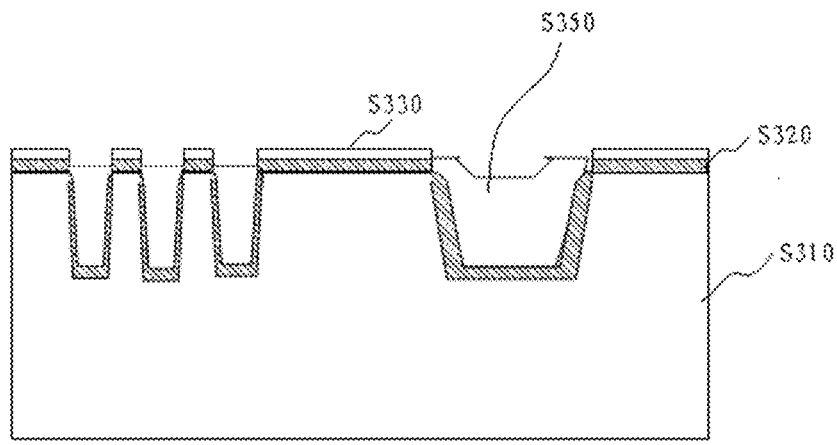

In step S3, the anti-reflection layer 340 is removed by dry etching. Referring to FIG. 4C, in the present step, the surface of the anti-reflection layer S340 is subject to bombardment using a mixed gas of argon, fluorocarbon, and oxygen under a condition of a temperature of 60° C., a pressure of 15 mTorr, and a time of 10 s. The bond of complex on the surface of the anti-reflection layer S340 is opened by bombarding, and the fluorocarbon can react with the anti-reflection layer S340 and finally etch the anti-reflection layer S340 off. The first silicon dioxide layer S350 located inside the trench is also etched during this step, such that a height difference between the silicon nitride layer S330 and the first silicon dioxide layer S350 will be increased. In the present step, the wafer surface is subject to the plasma process using argon, oxygen which exhibit a greater ion bombardment capability, as well as a certain amount of fluorocarbon. In the illustrated embodiment, the fluorocarbon is carbon tetrafluoride ($CF_4$), and a volume ratio of argon, carbon tetrafluoride, and oxygen in the mixed gas is 3:1:1. In alternative embodiments, other fluorocarbon can be employed, and the volume ratio of argon, carbon tetrafluoride, and oxygen can be determined according to actual situation. In the illustrated embodiment, the silicon oxynitride layer S340 after step S2 is dry etched for once using the mixed gas of argon, carbon tetrafluoride, and oxygen, in alternative embodiments, the number of times of dry etching to the silicon oxynitride layer S340 is not limited, as long as the silicon oxynitride layer S340 are entirely etched.

Figure 4D:
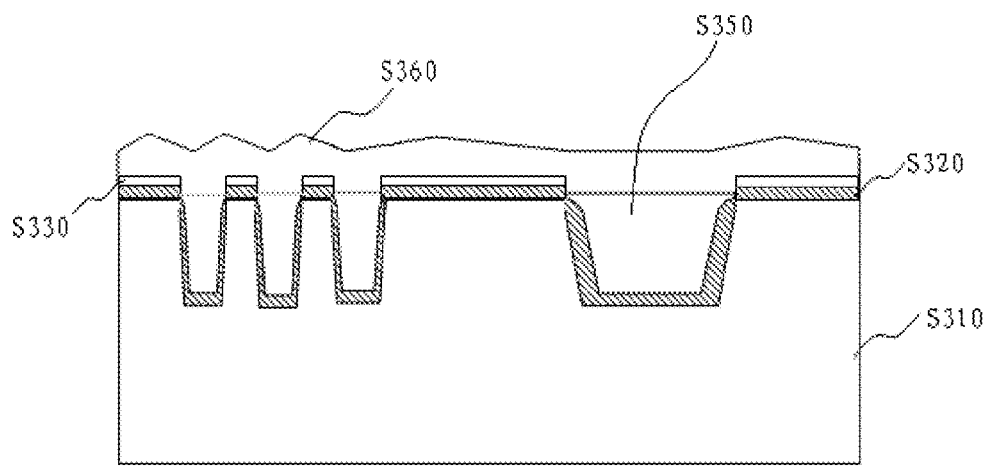

In step S4, a second silicon dioxide layer S360 is formed on a surface of the semiconductor wafer from which the anti-reflection layer S340 is removed. Referring to FIG. 4D, in the present step, the second silicon dioxide layer S360 is formed by using high-density plasma chemical vapor deposition. In the illustrated embodiment, the high-density plasma is a mixture of silane ($SiH_4$), $O_2$ and Ar, a deposition temperature ranges from 380° C. to 400° C., a pressure is 450 Torr, a deposition time is 100 s. In one embodiment, the deposition temperature is 390° C., and a thickness of the second silicon dioxide layer S360 deposited in this embodiment is 2 μm.

Figure 4E:
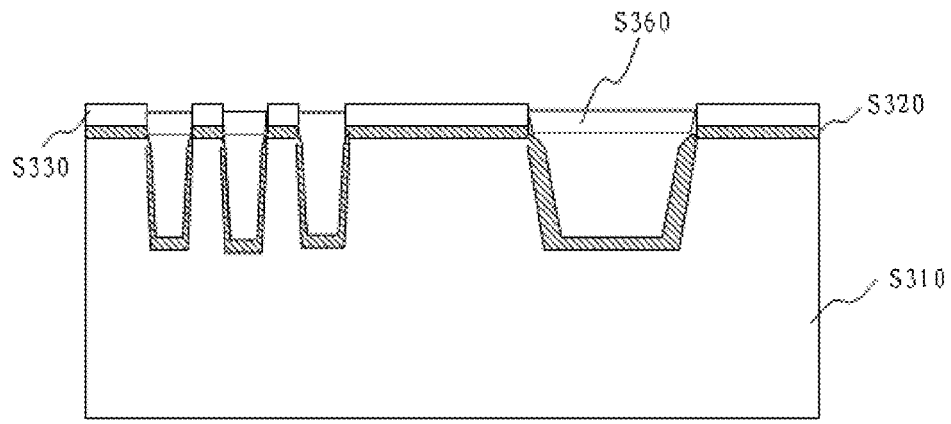

In step S5, the second silicon dioxide layer S360 formed in step S4 is polished until the silicon nitride layer S330 is exposed. Referring to FIG. 4E, in the present step, a slurry containing $SiO_2$ as a main composition is used to polish the second silicon dioxide layer S360 deposited in step S4 by direct CMP, which ends at the surface of the silicon nitride layer S330, such that the height difference between the silicon nitride layer S330 and the second silicon dioxide layer S360 will be decreased. In the illustrated embodiment, this step is performed under an ambient temperature and pressure, just like step S2, and the polishing time is 30 s to 50 s. In one embodiment, the slurry is a mixture containing at least two ingredients, in which the proportion of $SiO_2$ in the mixture is greater than that of other ingredients. In alternative embodiments, the slurry can be merely made of $SiO_2$. In one embodiment, the process conditions of step S5 and step S2 can be different, which are specifically determined according to actual production conditions and the flattening degree of the silicon oxynitride layer.

Figure 4F:
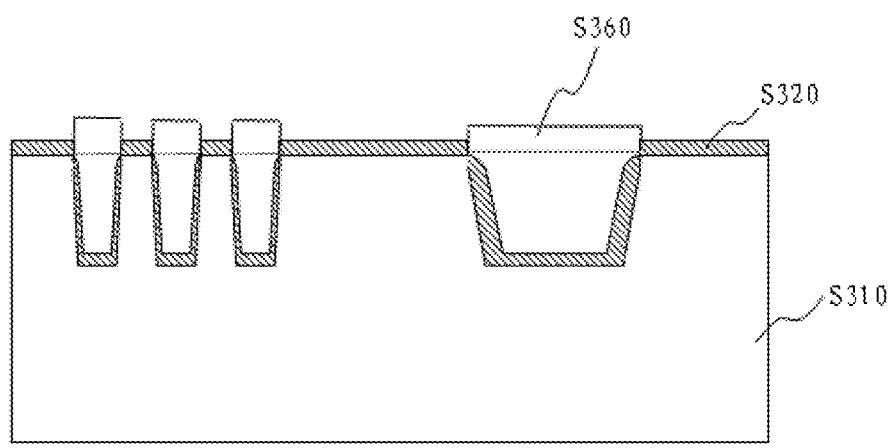

In step S6, the silicon nitride layer S330 is removed. Referring to FIG. 4F, after polishing in step S5, the silicon nitride layer S330 is entirely exposed. In this step, the silicon nitride layer S330 is reacted with an acid to completely remove the silicon nitride layer S330, thus forming an active region and an isolation region. In one embodiment, the acid is phosphoric acid, and the reaction temperature is 150° C., the reaction time is 1800 s. In alternative embodiments, the acid is not limited to phosphoric acid, and the reaction temperature and the reaction time can be determined according to actual conditions.

In the illustrated embodiment, the substrate is a silicon substrate; the oxidation layer formed on the surface of the substrate is made of silicon dioxide with a thickness of 110 angstroms. A thickness of the silicon nitride layer is 1500 angstroms. A thickness of the anti-reflection layer is 300 angstroms. In alternative embodiments, the substrate can be made of other materials.

It should be noted that, in one embodiment, different process parameters can be employed depending on the actual production conditions.

Figure 5:
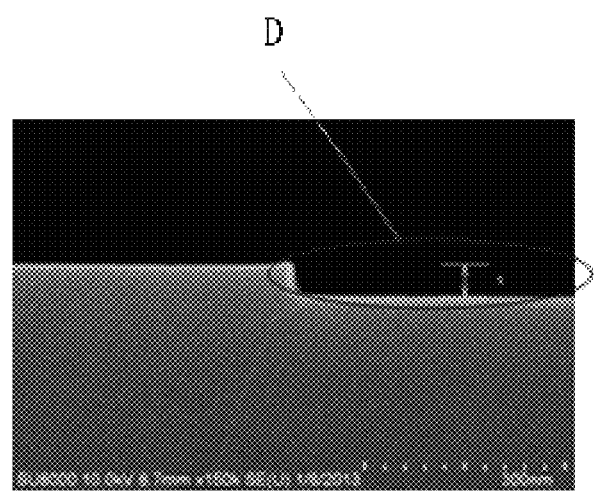
FIG. 5 is a picture showing the silicon nitride is removed in the polishing process according to one embodiment.

FIG. 5 is a picture showing the silicon nitride is removed in the polishing process according to one embodiment. Referring to FIG. 5, the silicon nitride is completely removed in the polishing process according to one embodiment.

In the process of the present invention, there is no need to add an extra reverse STI mask, a corresponding exposing, etching, and rinsing, thus simplifying the process. The present invention uses silicon oxynitride as the anti-reflection layer, such that the control for CD is relatively simple, and the silicon nitride can be peeled off effectively.

Although the description is illustrated and described herein with reference to certain embodiments, the description is not intended to be limited to the details shown. Modifications may be made in the details within the scope and range equivalents of the claims.

What is claimed is:

1. A chemical-mechanical polishing process based on a silicon oxynitride anti-reflection layer, comprising:
    providing a semiconductor wafer, the semiconductor wafer comprising a substrate, an oxidation layer formed on the substrate, a silicon nitride layer formed on the oxidation layer, an anti-reflection layer formed on the silicon nitride layer, a trench extending through the anti-reflection layer and into the substrate, and a first silicon dioxide layer filled in the trench and covering the anti-reflection layer;
    chemical mechanical polishing the first silicon dioxide layer until the anti-reflection layer is exposed;
    removing the anti-reflection layer by dry etching;
    forming a second silicon dioxide layer on a surface of the semiconductor wafer from which the anti-reflection layer is removed;
    chemical mechanical polishing the second silicon dioxide layer until the silicon nitride layer is exposed; and
    removing the silicon nitride layer.

2. The chemical-mechanical polishing process according to claim 1, wherein the anti-reflection layer is a silicon oxynitride layer.

3. The chemical-mechanical polishing process according to claim 1, wherein the first silicon dioxide layer is formed using high-density plasma chemical vapor deposition, wherein the high-density plasma is a mixture of SiH4, O2 and Ar, a deposition temperature ranges from 380° C. to 400° C., a pressure is 450 Torr, a deposition time is 220 s.

4. The chemical-mechanical polishing process according to claim 1, wherein during polishing the first silicon dioxide layer until the anti-reflection layer is exposed, a slurry for polishing contains SiO2 as a main composition, and a polishing time is from 30 s to 50 s.

5. The chemical-mechanical polishing process according to claim 1, wherein the removing the anti-reflection layer by dry etching is performed by using a mixed gas of argon, fluorocarbon, and oxygen with a temperature of 60° C., a pressure of 15 mTorr, and a time of 10 s.

6. The chemical-mechanical polishing process according to claim 1, wherein the second silicon dioxide layer is formed using high-density plasma chemical vapor deposition, wherein the high-density plasma is a mixture of SiH4, O2 and Ar, a deposition temperature ranges from 380° C. to 400° C., a pressure is 450 Torr, a deposition time is 100 s.

7. The chemical-mechanical polishing process according to claim 1, wherein during polishing the second silicon dioxide layer until the silicon nitride layer is exposed, a slurry for polishing contains SiO2 as a main composition, and a polishing time is from 30 s to 50 s.

8. The chemical-mechanical polishing process according to claim 1, wherein the silicon nitride layer is removed by phosphoric acid at a temperature of 150° C. with a time of 1800 s.

9. The chemical-mechanical polishing process according to claim 5, wherein a volume ratio of argon, fluorocarbon, and oxygen in the mixed gas is 3:1:1.

10. The chemical-mechanical polishing process according to claim 1, wherein the substrate is a silicon substrate, the oxidation layer formed on the substrate is made of silicon dioxide, a thickness of the silicon dioxide layer is 110 angstroms, a thickness of the silicon nitride layer is 1500 angstroms, and a thickness of the anti-reflection layer is 300 angstroms.

* * * * *